(12) United States Patent
Deguchi

(10) Patent No.: US 6,385,110 B1
(45) Date of Patent: May 7, 2002

(54) MULTILEVEL NON-VOLATILE SEMICONDUCTOR MEMORY DEVICE

(75) Inventor: Yuushi Deguchi, Kanagawa (JP)

(73) Assignee: NEC Corporation, Tokyo (JP)

( * ) Notice: Subject to any disclaimer, the term of this patent is extended or adjusted under 35 U.S.C. 154(b) by 20 days.

(21) Appl. No.: 09/639,339

(22) Filed: Aug. 16, 2000

(30) Foreign Application Priority Data

Aug. 16, 1999 (JP) ............................................. 11-229630

(51) Int. Cl.[7] ................................................. G11C 7/02
(52) U.S. Cl. ............... 365/210; 365/185.03; 365/185.2; 365/200
(58) Field of Search ........................... 365/210, 185.03, 365/185.2, 185.24, 194, 200

(56) References Cited

U.S. PATENT DOCUMENTS 5,570,315 A * 10/1996 Tanaka et al. .......... 365/185.22
5,652,719 A * 7/1997 Tanaka et al. .......... 365/185.03
6,009,040 A * 12/1999 Choi et al. ................... 365/233

FOREIGN PATENT DOCUMENTS

JP          02-251480  A   *   9/2000

* cited by examiner

*Primary Examiner*—Richard Elms
*Assistant Examiner*—Hien Nguyen
(74) *Attorney, Agent, or Firm*—Young & Thompson

(57) ABSTRACT

The present invention provides a multilevel non-volatile semiconductor memory device comprising: plural memory cells having plural threshold levels for allowing the plural memory cells to turn ON or OFF in accordance with relationships of word levels to the plural threshold levels; a word level generator circuit generating the word levels in every read out time periods for the plural threshold levels; a memory cell read-out circuit for reading out informations from the memory cells; dummy memory cells receiving inputs of the word levels and having substantially the same threshold levels as the memory cells for allowing the dummy cells to turn ON with delay from the memory cells; and a read out end timing controller for controlling the word level generator circuit to discontinue rising the word level when the dummy memory cell turns ON, and also for controlling the memory cell read-out circuit to finish the read out operations.

18 Claims, 12 Drawing Sheets

MULTILEVEL NON-VOLATILE SEMICONDUCTOR MEMORY DEVICE

BACKGROUND OF THE INVENTION

The present invention relates to a semiconductor memory device, and more particularly to a multilevel non-volatile semiconductor memory device exhibiting a stable reading operation.

The multilevel non-volatile semiconductor memory device has memory cells, each of which allows reading out operation of informations of two or more bits. FIG. 1 is a block diagram illustrative of a conventional multilevel non-volatile semiconductor memory device which controls a constant reading out time period and a word level. The information storage unit comprises a memory cell array 901 which is capable of setting plural threshold values. Namely, the conventional multilevel non-volatile semiconductor memory device has the memory cell array 901, a word level generator circuit 902 generating a word level which corresponds to a threshold value, and a sense amplifier 903 reading out an information. The memory cell array 901 is connected to the word level generator circuit 902. The memory cell array 901 is connected to the sense amplifier 903.

A delay circuit 904 is also provided which is connected to the word level generator circuit 902 and also connected to the sense amplifier 903. The delay circuit 904 controls a constant reading out time period and a word level generation time period. A read-out signal 905 is inputted into the delay circuit 904, whereby the delay circuit 904 generates a read-out start pulse signal which is transmitted to the sense amplifier 903, so that the sense amplifier 903 starts the read-out operation. FIG. 2 is a diagram illustrative of the word level, the sense amplifier operation and the read-out start signal of the conventional multilevel non-volatile semiconductor memory device of FIG. 1. The word level generator circuit 902 sequentially generates different word levels 1, 2 and 3. Namely, the first word level 1 is generated in a first read out time period 1, during which the sense amplifier 903 reads out informations from memory cells in the memory cell array 901, wherein the memory cells turned on by the first word level VT0. The second word level 2 is generated in a second read out time period 2, during which the sense amplifier 903 reads out informations from memory cells in the memory cell array 901, wherein the memory cells turned on by the second word level VT1. The third word level 3 is generated in a third read out time period 3, during which the sense amplifier 903 reads out informations from memory cells in the memory cell array 901, wherein the memory cells turned on by the third word level VT2.

Meanwhile, the multilevel non-volatile semiconductor memory device may have dummy memory cells in addition to the memory cells.

In Japanese laid-open patent publication No. 6-60678, it is disclosed that dummy cells have a higher threshold voltage than selecting word levels effective to select the memory cells, and a dummy cell selecting circuit is also provided for selecting the dummy cells in synchronous with the selecting operation to memory cell array. Further a first stage amplifier circuit is provided which includes an amplifying MOSFET which has a source, into which a read out current is supplied through the dummy cell selecting circuit. A read out operation end timing signal is generated in accordance with an output from a drain of the amplifying MOSFET.

The former one of the above described conventional multilevel non-volatile semiconductor memory device has the following problems. It is difficult to avoid or control variations in threshold voltage of the plural memory cells in the memory cell array, wherein the variations are due to the manufacturing processes. The variations in threshold voltage of the plural memory cells in the memory cell array causes a first problem in difficulty for the delay circuit 904 to control the read-out time period. FIG. 3 is a variation in the necessary time for the sense amplifier to perform read-out operation as a sense amplifier ability over voltage, wherein a read line represents the sense amplifier whilst a broken line represents the delay circuit. As the voltage is low, the necessary time for the sense amplifier to perform read-out operation is long and the sense amplifier ability is low. As the voltage is high, the necessary time for the sense amplifier to perform read-out operation is short and the sense amplifier ability is high. However, the voltage is further increased, then a rate of shortening the necessary time for the sense amplifier to perform read-out operation becomes low. The constant read-out time period is controlled by the delay circuit 904. It is possible that the constant read-out time period is shortened to be insufficient when a power voltage is changed to high or low voltage levels from the necessary level for the sense amplifier, whereby the read-out time period is ended without turning the selected memory cells ON.

If the read-out time period is intentionally extended to avoid the above problem, then another problem is raised, wherein the read-out time period is restricted in accordance with a regulation. Namely, it is necessary that the read-out time period is set to be sufficiently short for complying with the regulation. The read-out time period depends upon an ambient temperature.

The extension of the read-out time period also raises another problem in that the memory cells erroneously turn ON even the memory cells should have to turn OFF. FIG. 4 is a diagram illustrative of variations in word level over time when the word level is supplied to the memory cell, when there is a difference in threshold voltage between an upper limit of memory cells which should turn ON and a lower limit of other memory cells which should turn OFF and also when the word level is high as a word level "A". In this case, if the read-out time period is extended, then all of the memory cells which should turn ON are turn ON, whilst some of the other memory cells which should turn OFF are erroneously turn ON. If the read-out time period is extended beyond the acceptable time period, then a slight increase in the word level causes the other memory cells, which should turn OFF, to turn ON.

The word level generator circuit 902 generates a word level which is slightly higher than the threshold level of the memory cells which should turn ON based on the threshold level. As described above, it is difficult to precisely control the threshold level of the memory cells, for which reason it is difficult to precisely control the word level. If the word level is as a word level "B" which is slightly higher than the upper limit of the memory cells which should turn ON, then it is necessary that the read out time period is set long until entering into an OK2 region. If the word level is as the word level "A" which is extensively higher than the upper limit of the memory cells which should turn ON, then the extension of the read out time period to enter into an NG1 region causes the memory cells which should turn OFF to erroneously turn ON.

As described above, it is important for the read out operation from the memory cells to take a matching between the read out time period and the word level. Notwithstanding, it is difficult for the conventional circuit configuration to control the threshold voltage of the memory cells and also to control both the read out time period and the word level.

The above Japanese publication No. 6-60678 is silent on detection and control to the word level in the multilevel memory system.

In the above circumstances, it had been required to develop a novel multilevel non-volatile semiconductor memory device free from the above problems.

SUMMARY OF THE INVENTION

Accordingly, it is an object of the present invention to provide a novel multilevel non-volatile semiconductor memory device free from the above problems.

It is a further object of the present invention to provide a novel multilevel non-volatile semiconductor memory device which is capable of controlling an optimum read-out time period for the sense amplifier ability under given power voltage and ambient temperature.

It is still further object of the present invention to provide a novel multilevel non-volatile semiconductor memory device which is capable of realizing a highly accurate control to the word level.

It is yet a further object of the present invention to provide a novel multilevel non-volatile semiconductor memory device which exhibits highly stable read out operations.

The present invention provides a multilevel non-volatile semiconductor memory device comprising: plural memory cells having plural threshold levels for allowing the plural memory cells to turn ON or OFF in accordance with relationships of word levels to the plural threshold levels; a word level generator circuit generating the word levels in every read out time periods for the plural threshold levels; a memory cell read-out circuit for reading out informations from the memory cells; dummy memory cells receiving inputs of the word levels and having substantially the same threshold levels as the memory cells for allowing the dummy cells to turn ON with delay from the memory cells; and a read out end timing controller for controlling the word level generator circuit to discontinue rising the word level when the dummy memory cell turns ON, and also for controlling the memory cell read-out circuit to finish the read out operations.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
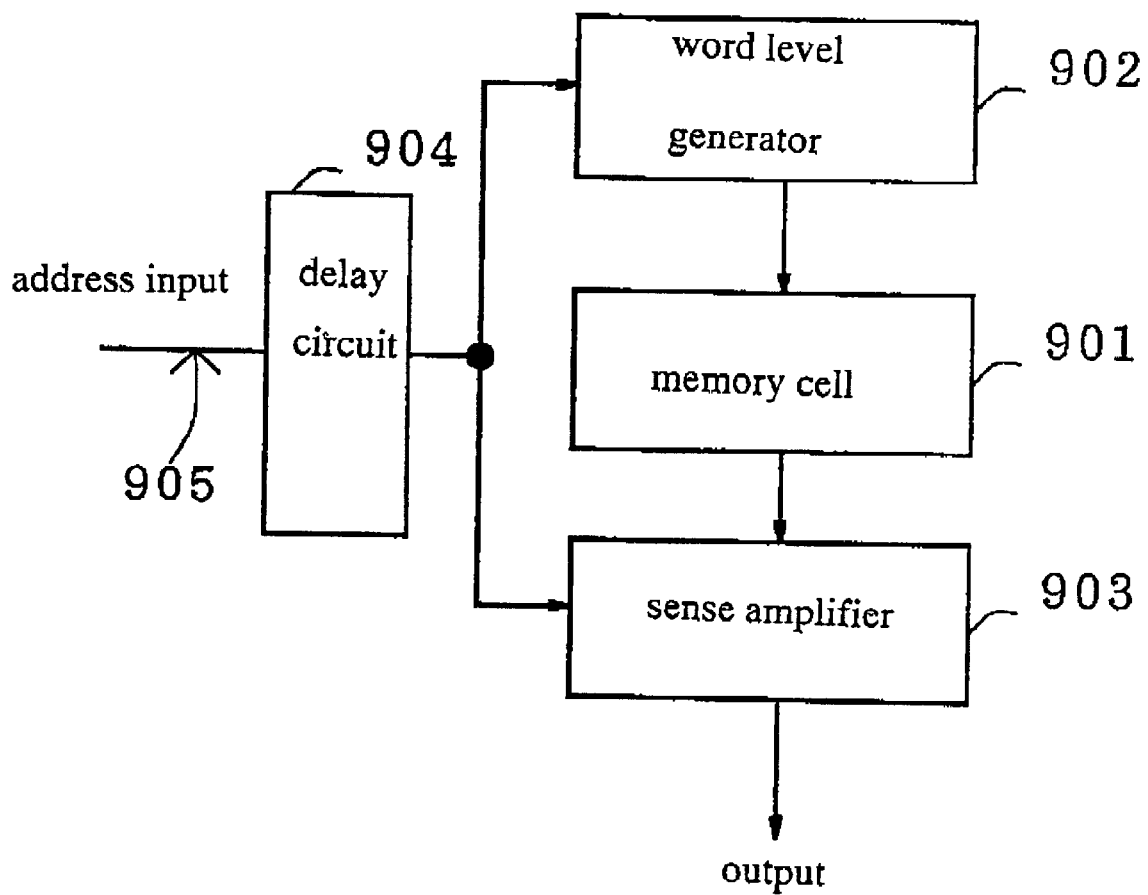
FIG. 1 is a block diagram illustrative of a conventional multilevel non-volatile semiconductor memory device which controls a constant reading out time period and a word level.
Figure 2:
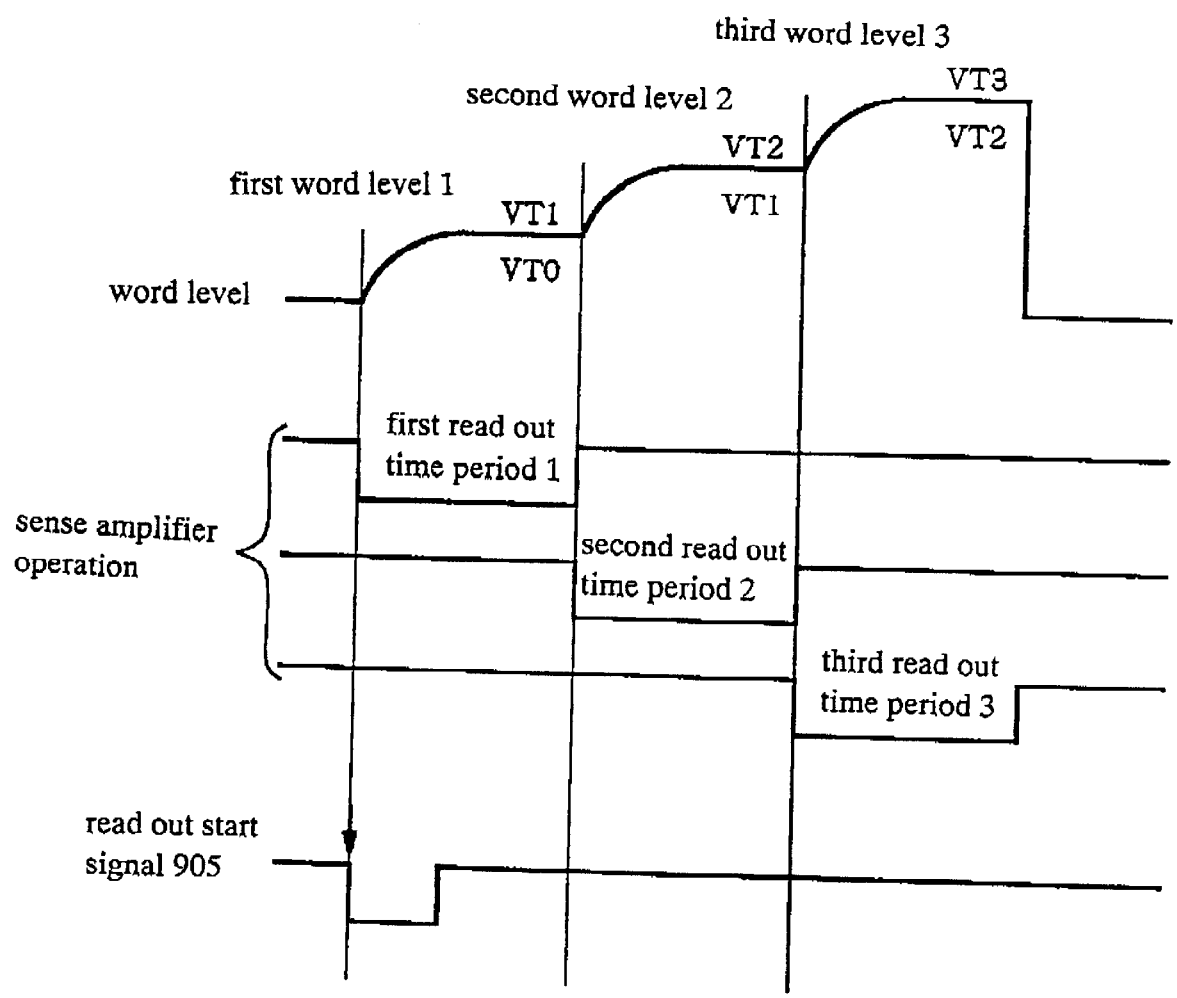
FIG. 2 is a diagram illustrative of the word level, the sense amplifier operation and the read-out start signal of the conventional multilevel non-volatile semiconductor memory device of FIG. 1.
Figure 3:
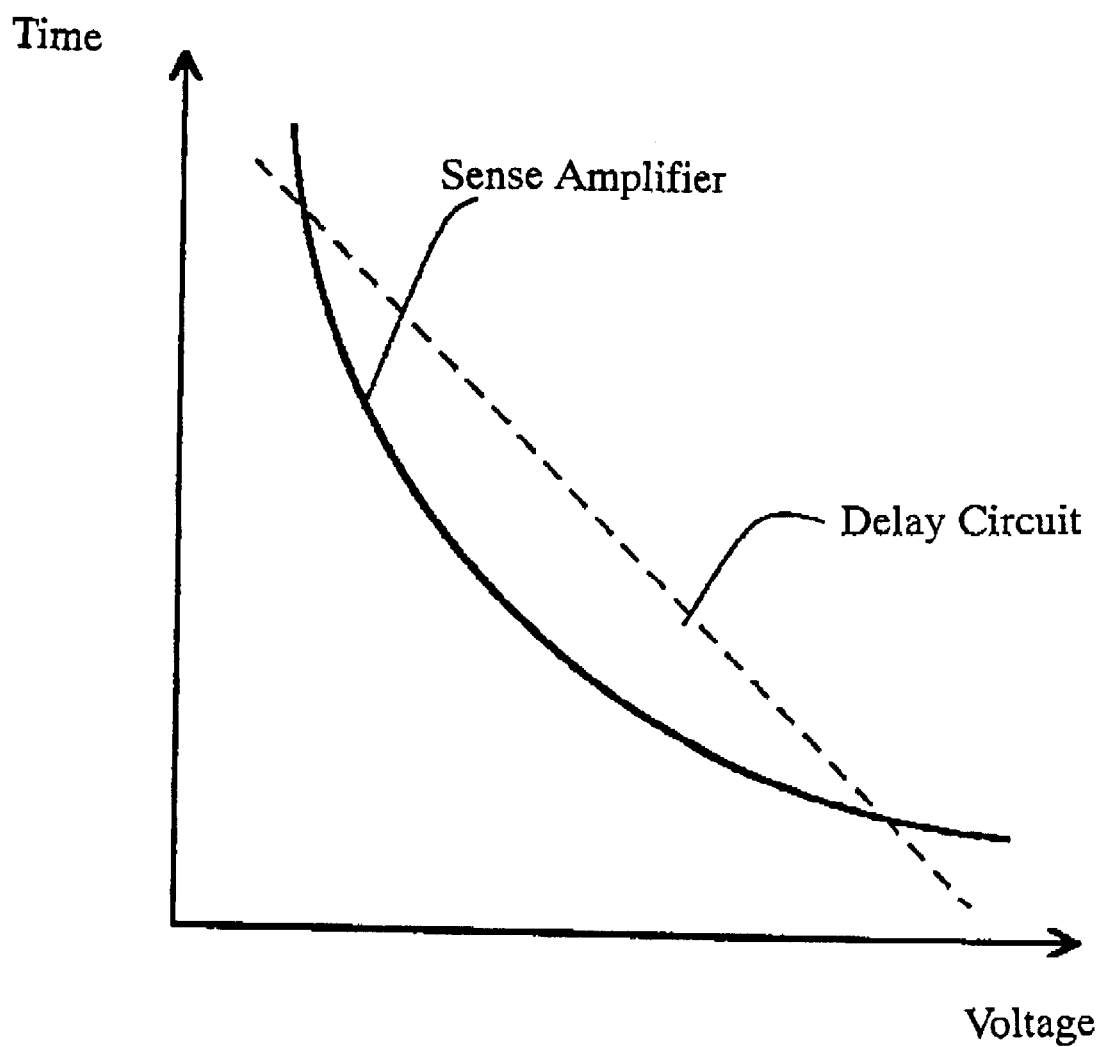
FIG. 3 is a variation in the necessary time for the sense amplifier to perform read-out operation as a sense amplifier ability over voltage, wherein a read line represents the sense amplifier whilst a broken line represents the delay circuit.

The first invention provides a multilevel non-volatile semiconductor memory device comprising: plural memory cells having plural threshold levels for allowing the plural memory cells to turn ON or OFF in accordance with relationships of word levels to the plural threshold levels; a word level generator circuit generating the word levels in every read out time periods for the plural threshold levels; a memory cell read-out circuit for reading out informations from the memory cells; dummy memory cells receiving inputs of the word levels and having substantially the same threshold levels as the memory cells for allowing the dummy cells to turn ON with delay from the memory cells; and a read out end timing controller for controlling the word level generator circuit to discontinue rising the word level when the dummy memory cell turns ON, and also for controlling the memory cell read-out circuit to finish the read out operations.

It is preferable that the read-out end timing controller controls the memory cell read-out circuit to finish the read-out operation with a delay after the word level generator circuit has discontinued the rise of the word level.

It is also preferable that a ratio in the number of the dummy memory cells to the memory cells is increased from a minimum ratio necessary for controlling the read-out time period.

It is further preferable that the same number of the dummy memory cells as the memory cells are provided for each of word lines so that the dummy memory cells and the memory cells are alternately aligned along the each word line.

It is also preferable that the dummy memory cells have the same cell structure as the memory cells and the dummy memory cells are provided at end points of word lines, so that the dummy memory cells turn ON after the memory cells turn ON.

It is more preferable to further comprise additional dummy cells having the same structure as the memory cells, so that a start-timing of read out operation is detectable by confirming ON or OFF of the additional dummy cells.

It is further more preferable that the additional dummy memory cells are provided at start points of the word lines, so that the additional dummy memory cells turn ON before the memory cells turn ON.

It is more preferable to further comprise a read out start timing controller for controlling the word level generator circuit to rise the word level when the additional dummy memory cell turns ON.

It is also preferable that the dummy memory cells are higher in threshold level than the memory cells.

The second present invention provides a multilevel non-volatile semiconductor memory device having plural word lines. Each of the word line has: a word level generator circuit generating word levels supplied to the each word line in every read out time periods for plural threshold levels; plural memory cells being connected to the each word line, the plural memory cells having plural threshold levels for allowing the plural memory cells to turn ON or OFF in accordance with relationships of word levels to the plural threshold levels; a memory cell read-out circuit being connected to the each word line for reading out informations from the memory cells; at least a dummy memory cell being connected to the each word line for receiving inputs of the word levels and having substantially the same threshold levels as the memory cells connected to the each word line for allowing the at least one dummy cell to turn ON with delay from the memory cells; and at least a read out end timing controller being connected to the at least one dummy memory cell and also connected to the word level generator circuit for controlling the word level generator circuit to discontinue rising the word level when the at least one dummy memory cell turns ON, and also for controlling the memory cell read-out circuit to finish the read out operations.

It is preferable that the at least one read-out end timing controller controls the memory cell read-out circuit to finish the read-out operation with a delay after the word level generator circuit has discontinued the rise of the word level.

It is also preferable that a plurality of the dummy memory cell is provided for the each word line.

It is further preferable that the same number of the dummy memory cells as the memory cells are provided for the each word line so that the dummy memory cells and the memory cells are alternately aligned along the each word line.

It is also preferable that the at least one dummy memory cell has the same cell structure as the memory cells and the at least one dummy memory cell is provided at an end point of the each word line, so that the at least one dummy memory cell turns ON after the memory cells turn ON.

It is further preferable that the each word line further has at least an additional dummy cell having the same structure as the memory cells, so that a start-timing of read out operation is detectable by confirming ON or OFF of the at least one additional dummy cell.

It is further more preferable that the at least one additional dummy memory cell is provided at a start point of the each word line, so that the at least one additional dummy memory cell turns ON before the memory cells turn ON.

It is also preferable to further comprise at least a read out start timing controller to the each word line for controlling the word level generator circuit to rise the word level when the at least one additional dummy memory cell turns ON.

It is also preferable that the at least one dummy memory cell is higher in threshold level than the memory cells.

In accordance with the present invention, a multilevel non-volatile semiconductor memory device comprises: plural memory cells having plural threshold levels for allowing the plural memory cells to turn ON or OFF in accordance with relationships of word levels to the plural threshold levels; a word level generator circuit generating word levels in every read out time periods; a memory cell read-out circuit for reading out informations from the memory cells; dummy memory cells receiving inputs of the word levels and having substantially the same threshold levels as the memory cells for allowing the dummy cells to turn ON with delay from the memory cells; and a read out end timing controller for controlling the word level generator circuit to stop an increase of the word level when the dummy memory cell turns ON, and also for controlling the memory cell read-out circuit to finish the read out operations by the memory cell read-out circuit.

In accordance with the novel multilevel non-volatile semiconductor memory device, informations of two or more bits are read out from one memory cell unit. Even the threshold voltages of the memory cells vary, the novel multilevel non-volatile semiconductor memory device is capable of performing a highly accurate control to the read-out time period. The memory cells have plural threshold levels for allowing the memory cells to turn ON or OFF in accordance with relationships of the inputted word levels to the threshold levels. The word level generator circuit generates the word levels in every read out time periods for each of the plural threshold levels. The memory cell read-out circuit reads out informations from the memory cells.

The word levels as generated by the word level generator circuit are inputted into the memory cells and also into the dummy memory cells, so that the dummy memory cells having substantially the same threshold levels as the memory cells turn ON with delay from the memory cells. The read out end timing controller controls the word level generator circuit to stop the increase of the word level when the dummy memory cell turns ON, and also controls the memory cell read-out circuit to finish the read out operations by the memory cell read-out circuit.

The dummy memory cells turn ON by substantially the same threshold levels as the memory cells with delay from the memory cells. This means that when the dummy memory cells turn ON by a threshold voltage, all of the memory cells having the same threshold level have already turned ON. The read out end timing controller controls the word level generator circuit to stop the increase of the word level when the dummy memory cell turns ON, and also controls the memory cell read-out circuit to finish the read out operations by the memory cell read-out circuit. It is easy to control the word level and allow the read-out operation in the optimum read-out time period against various power voltage levels.

The word level generator circuit is required to sequentially generate every word levels which correspond to the individual or different threshold levels of the memory cells. The word level generator circuit has a predetermined threshold level and also has a circuit configuration for drop the predetermined threshold level to accord to each of the threshold levels of the memory cells. The memory cells are required to have plural threshold levels. It is possible to set the threshold levels by controlling ion-concentrations in floating gates of the switching transistors of the memory cells. The memory cell read out circuit is required to perform the reading out operation from the memory cells. The memory cell read out circuit may comprise a sense amplifier. The read out end timing controller is required to send a read out end signal to the word level generator and the memory cell read out circuit when the dummy memory cell turns ON. The read out end timing controller may comprise a sense amplifier.

The dummy memory cells are the same in operations as the memory cells but different only in the ON-timing from the memory cells. The dummy memory cells may be formed in the memory cell arrays. For example, the dummy memory cells have the same cell structure as the memory cells and the dummy memory cells are provided at ends of word lines.

The dummy memory cells may comprise the same cells as the memory cells. The dummy memory cells are provided at ends of word lines, so that the dummy memory cells finally or later turn ON. Each of the word lines is connected to the plural memory cells aligned along the word line. The memory cell at the end of the word line is used as the dummy memory cell, so that the dummy memory cell turns ON with the delay from the other memory cells connected to the same word line.

It is also important to control the threshold levels. In order to allow the dummy memory cell to control the read out time period, the dummy memory cell is higher in threshold level than the memory cells, wherein an area around the dummy memory cell is higher in dopant concentration than other area on which the memory cell regions are formed.

The threshold level of a subjected memory cell depends on the threshold levels of the memory cells arranged around the subjected memory cell. This is one cause of difficulty in making the threshold levels of the memory cells uniform. The threshold level of a subjected memory cell depends on the patterns of the memory cells. The dummy memory cell comprises the cell which is higher in threshold level than the other cells positioned around the cell, wherein an area around the dummy memory cell is higher in dopant concentration than other area on which the memory cell regions are formed, so that the ON-timing of the dummy memory cell is delayed.

In order to allow that the memory cell read-out time period is controlled by an output from the dummy memory cell, it is sufficient to provide a single dummy memory cell for the plural memory cells. It is, however, possible to provide plural dummy memory cells for the plural memory cells. It is possible that a ratio in the number of the dummy memory cells to the memory cells is increased from a minimum ratio necessary for allowing a highly accurate control to read-out time period even if the individual memory cells vary in threshold level.

If the dummy memory cell is placed in a follower stage to one memory cell, it is acceptable to judge that all of the memory cells which should turn ON have turned ON when the dummy memory cell turns ON. It is also possible that the dummy memory cell is higher in threshold level than the memory cells. As a result, it is possible to realize a highly accurate control to the read-out time period even if the individual memory cells vary in threshold level.

It is also possible that an additional cell having the same structure as the memory cell is provided at a most start point of the memory cell array, so that a start-timing of read out operation is detectable by confirming ON or OFF of the additional cell.

In order to control the read-out time period of the memory cells, it is necessary to confirm not only the end-timing of the read-out operation but also the start-timing thereof. The additional cell having the same structure as the memory cell is provided at a most start point of the memory cell array, so that the start-timing of read out operation is detectable by confirming ON or OFF of the additional cell.

The control to the read-out time period is made with operation of the read-out timing controller for reading out the ON-timing of the dummy memory cell. This is allowable without taking any timing of discontinuing the rise of the word level and also any timing of discontinuing the read-out operation of the memory cells. It is possible that the read-out end timing controller controls the memory cell read-out circuit to finish the read-out operation with a delay from when the word level generator circuit has discontinued the rise of the word level for ensuring a sufficient read-out time period.

In case, the timing for discontinuing the rise of the word level is different from the timing for discontinuing the read-out operation from the memory cells. In response to this difference in timing, the read-out end timing controller controls the memory cell read-out circuit to finish the read-out operation with a delay from when the word level generator circuit has discontinued the rise of the word level for ensuring a sufficient read-out time period.

PREFERRED EMBODIMENT

Figure 5:
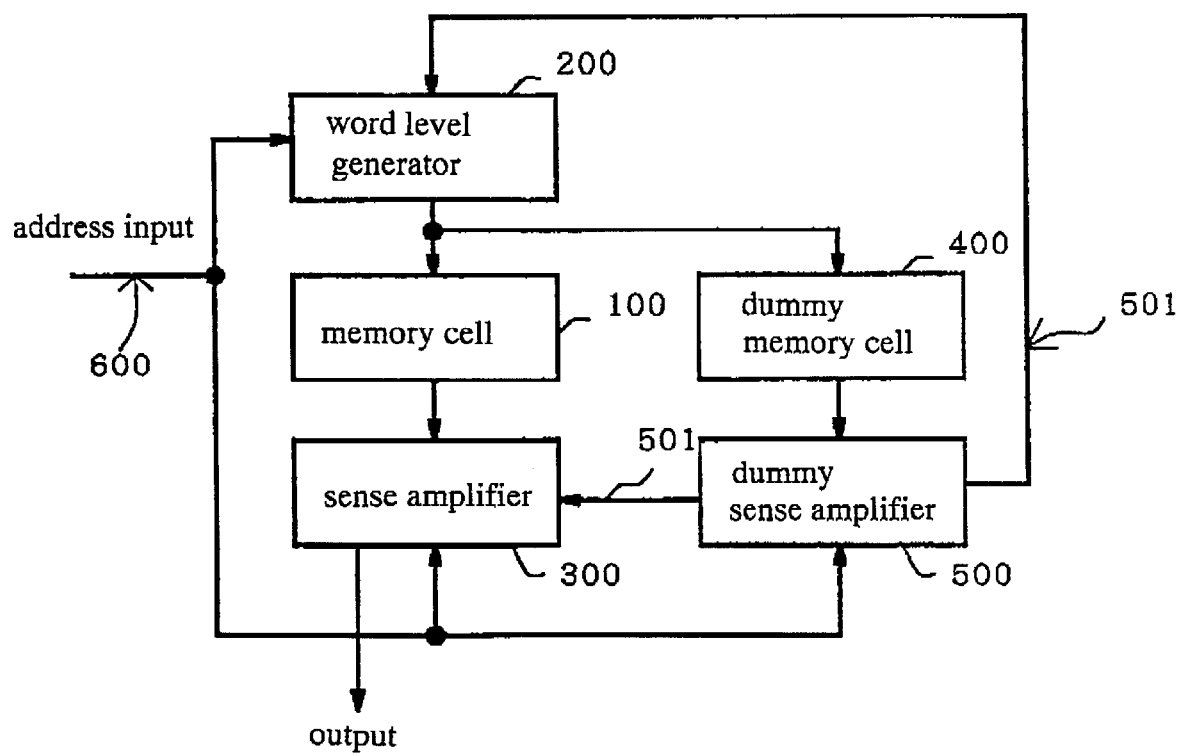
FIG. 5 is a block diagram illustrative of a first novel multilevel non-volatile semiconductor memory device additionally provided with dummy memory cells and a dummy sense amplifier for realizing a highly accurate control to the read-out time period in a first embodiment according to the present invention.

A first embodiment according to the present invention will be described in detail with reference to the drawings. In accordance with the novel multilevel non-volatile semiconductor memory device, dummy memory cells and a dummy sense amplifier are additionally provided for realizing a highly accurate control to the read-out time period. FIG. 5 is a block diagram illustrative of a first novel multilevel non-volatile semiconductor memory device additionally provided with dummy memory cells and a dummy sense amplifier for realizing a highly accurate control to the read-out time period in a first embodiment according to the present invention.

The first novel multilevel non-volatile semiconductor memory device has memory cells 100 capable of having plural threshold voltages. The first novel multilevel non-volatile semiconductor memory device also has a word level generator circuit 200 for generating plural word levels based on the plural threshold voltages of the memory cells 100. The word level generator circuit 200 is connected to the memory cells 100. The first novel multilevel non-volatile semiconductor memory device also has a sense amplifier 300 for performing read-out operations from the memory cells 100. The sense amplifier 300 is also connected to the memory cells 100.

The memory cells 100 have four different threshold voltages VT0, VT1, VT2 and VT3. The word level generator circuit 200 generates three different word levels, for example, a first word level 1 for causing the memory cells having the first threshold voltage VT0 to turn ON, a second word level 2 for causing the memory cells having the second threshold voltage VT1 to turn ON, and a third word level 3 for causing the memory cells having the third threshold voltage VT2 to turn ON. The sense amplifier 300 serves as the memory cell read-out circuit for reading out informations from the memory cells 100.

The first novel multilevel non-volatile semiconductor memory device further has dummy memory cells 400 having the same cell structure as the memory cells 100. The dummy memory cells 400 are connected to the memory cells 100. The dummy memory cells 400 are also connected to the word level generator circuit 200, so that the word level voltages generated by the word level generator circuit 200 are applied to both the memory cells 100 and the dummy memory cells 400. The first novel multilevel non-volatile semiconductor memory device further has a dummy sense amplifier 500 which is connected to the dummy memory cells 400. The dummy sense amplifier 500 is also connected to the sense amplifier 300. The dummy sense amplifier 500 is also connected to the word level generator circuit 200. The dummy sense amplifier 500 has the same circuit configuration as the sense amplifier 300. The dummy sense amplifier 500 performs read-out operations from the dummy memory cells 400 in accordance with the word level voltages applied to the dummy memory cells 400. In the dummy memory cells 400, the threshold voltage is previously prepared for causing turning-ON operation during the read out time period, for example, the first, second and third threshold voltages VT0, VT1, and VT2 are prepared. It is necessary that the dummy memory cells 400 are slowest in ON-timing or ON-speed, for which reason the dummy memory cells 400 are provided at ends of the word lines, wherein the ends of the word lines have the largest delays. The dummy memory cells 400 are higher in threshold voltage that the memory cells 100.

The dummy sense amplifier 500 generates a read-out completion signal 501 when the dummy memory cells 400 turns ON by the predetermined threshold voltage. The read-out completion signal 501 is transmitted to the sense amplifier 300 and the word level generator circuit 200. The word level generator circuit 200 discontinues the rise of the word level upon receipt of the input of the read-out completion signal 501. The sense amplifier 300 also discontinues the read-out operation with a delay from the input timing of the read-out completion signal 501 for ensuring a sufficient read out operation time period. The dummy sense amplifier 500 serves as the read out end timing controller.

A read out start signal 600 instructing to start the read out operation is inputted into the word level generator circuit 200, the sense amplifier 300 and the dummy sense amplifier 500. Upon receipt of the read-out start signal 600, the word level generator circuit 200, the sense amplifier 300 and the dummy sense amplifier 500 start the individual operations. Upon receipt of the read-out completion signal 501 from the dummy sense amplifier 500, the read-out start signal 600 and the word level generator circuit 200 discontinue the read-out operations.

Figure 6:
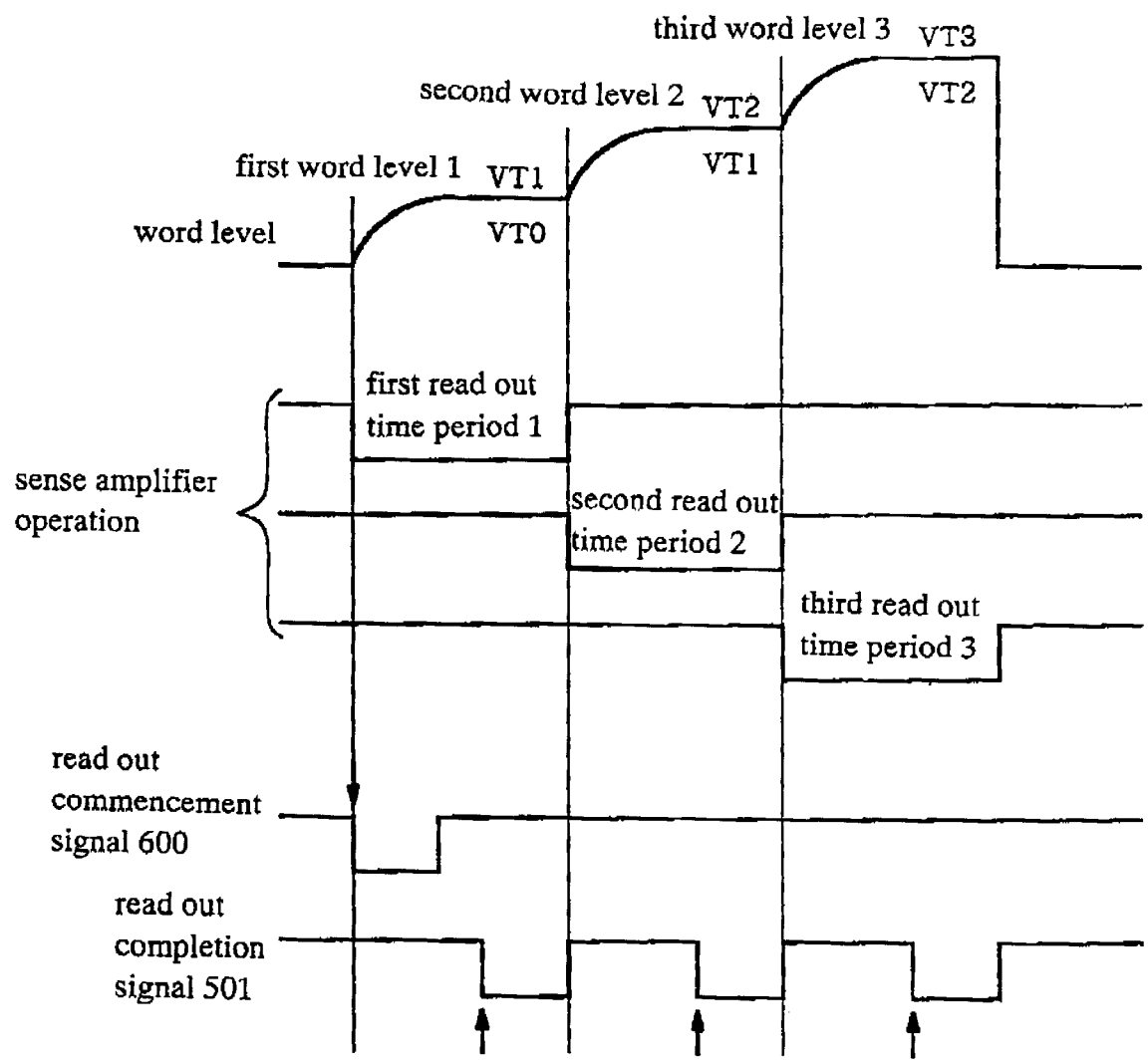
FIG. 6 is a diagram illustrative of the word level, the sense amplifier operation and the read-out start signal and the read-out completion signal of the first novel multilevel non-volatile semiconductor memory device of FIG. 5.

Operations of the above first novel multilevel non-volatile semiconductor memory device will subsequently be described in detail. FIG. 6 is a diagram illustrative of the word level, the sense amplifier operation and the read-out start signal and the read-out completion signal of the first novel multilevel non-volatile semiconductor memory device of FIG. 5. The word level generated by the word level generator circuit 200 is shown. The read out operation timing of the sense amplifier 300 is also shown. The input timing of the read-out start signal 600 into the word level generator circuit 200, the sense amplifier 300 and the dummy sense amplifier 500 is shown. The output timing of the read-out completion signal from the dummy sense amplifier 500 is shown.

In order to conduct the read-out operations from the memory cells 100, an address is inputted whereby the read-out start signal 600 is generated which is then transmitted into the word level generator circuit 200, the sense amplifier 300 and the dummy sense amplifier 500. The word level generator circuit 200 starts to rise the word level to be supplied to the memory cells 100 and the dummy memory cells 400. The word level generator circuit 200 sequentially generate three different word levels, for example, the first word level 1, the second word level 2 which is higher than the first word level 1 and the third word level 3 which is higher than the second word level 2.

The sense amplifier 300 causes the memory cells having a first threshold voltage VT0 to turn ON upon receipt of the input of the first word level 1, so that the sense amplifier 300 performs a first read-out operation from the ON-memory cells in a first read-out time period 1. The sense amplifier 300 causes the memory cells having a second threshold voltage VT1 to turn ON upon receipt of the input of the second word level 2, so that the sense amplifier 300 performs a second read-out operation from the ON-memory cells in a second read-out time period 2. The sense amplifier 300 causes the memory cells having a third threshold voltage VT2 to turn ON upon receipt of the input of the third word level 3, so that the sense amplifier 300 performs a third read-out operation from the ON-memory cells in a third read-out time period 3. The dummy sense amplifier 500 causes the dummy memory cells having a first threshold voltage VT0 to turn ON upon receipt of the input of the first word level 1. The dummy sense amplifier 500 causes the dummy memory cells having a second threshold voltage VT1 to turn ON upon receipt of the input of the second word level 2. The dummy sense amplifier 500 causes the dummy memory cells having a third threshold voltage VT2 to turn ON upon receipt of the input of the third word level 3.

The dummy sense amplifier 500 starts the read-out operations from the dummy memory cells 400 at the same time when the sense amplifier 300 starts the read-out operations from the memory cell 100, whereby the dummy sense amplifier 500 starts to read out the same threshold voltage from the dummy memory cells 400 as the sense amplifier 300 starts to read out from the memory cells 100. The dummy sense amplifier 500 operates to judge ON or OFF of the cell which is slowest in ON-speed during the cells having the same threshold voltage levels. When the dummy sense amplifier 500 generates or outputs the read-out completion signal 501, all of the memory cells 100 having the same threshold voltage levels, which should turn ON, have already turned ON.

The read-out completion signal 501 is also supplied to the word level generator circuit 200 whereby the word level generator circuit 200 discontinues the rise of the word level. The read-out completion signal 501 is also supplied with a delay to the sense amplifier 300 for ensuring the sufficient read-out operation time period. The read-out completion signal 501 serves as a signal which instructs the discontinuation of the read-out operation in each of the first, second and third read out time periods 1, 2 and 3. After the read-out completion signal 501 is generated for the first read-out time period 1, then the second read out time period 2 starts. After the read-out completion signal 501 is generated for the second read-out time period 2, then the third read out time period 3 starts. When the read-out completion signal 501 is generated for the third read-out time period 3, the read-out operation for reading multilevel informations from one memory cell is completed.

As described above, in accordance with the present invention, the first novel multilevel non-volatile semiconductor memory device is additionally provided with both the dummy memory cells 400 and the dummy sense amplifier 500, wherein upon output of the read-out completion signal 501 from the dummy sense amplifier 500, the sense amplifier 300 discontinues the read-out operation from the memory cells 100, and the word level generator circuit 200 discontinues the rise of the word level. The output timing of the read-out completion signal 501 from the dummy sense amplifier 500 depends upon the ON or OFF state of the dummy memory cells 400. When all of the memory cells which should turn ON in the memory cells 100 have turn ON, the read-out operation is completed. After all of the memory cells which should turn ON in the memory cells 100 have turn ON, then the dummy memory cells 400 turn ON to cause the dummy sense amplifier 500 to generate the read-out completion signal 501 which gives the end timing of the read-out operation from the memory cells 100.

Figure 7:
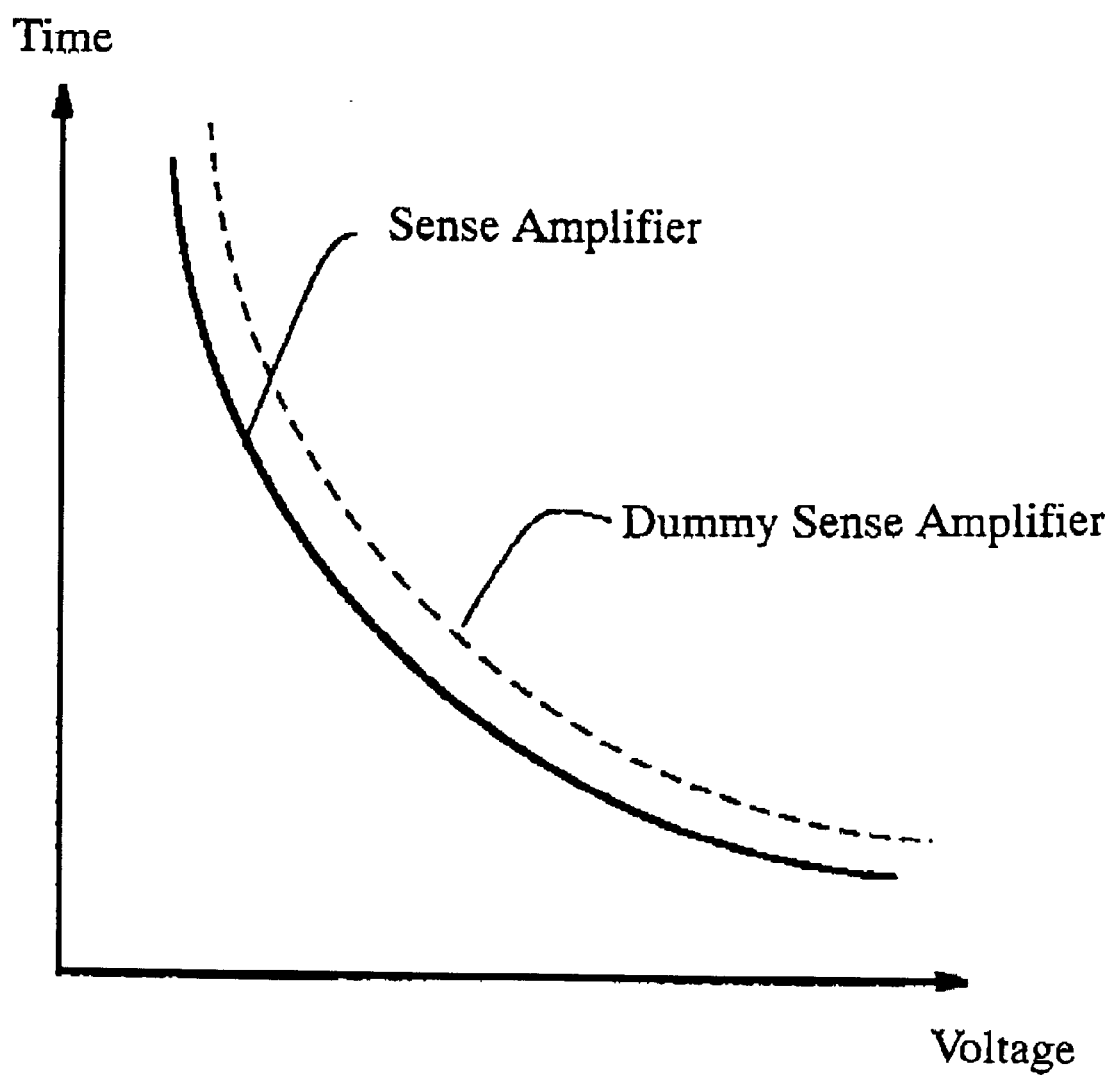
FIG. 7 is a variation in the necessary time for the sense amplifier and the dummy sense amplifier to perform read-out operations as sense amplifier abilities over voltage of the first novel multilevel non-volatile semiconductor memory device of FIG. 5.

The dummy sense amplifier 500 have the same circuit configuration as the sense amplifier 300. A voltage-time characteristic of the dummy sense amplifier 500 is the same as a voltage-time characteristic of the sense amplifier 300. FIG. 7 is a variation in the necessary time for the sense amplifier and the dummy sense amplifier to perform read-out operations as sense amplifier abilities over voltage of the first novel multilevel non-volatile semiconductor memory device of FIG. 5, wherein a read line represents the sense amplifier whilst a broken line represents the dummy sense amplifier. A voltage-time characteristic of the dummy sense amplifier 500 is the same as a voltage-time characteristic of the sense amplifier 300. As the voltage is low, the individually necessary times for the sense amplifier 300 and the dummy sense amplifier 500 to perform read-out operation are long and the individual abilities of the sense amplifier 300 and the dummy sense amplifier 500 are low. As the voltage is high, the individually necessary times for the sense amplifier 300 and the dummy sense amplifier 500 to perform read-out operation are short and the individual abilities of the sense amplifier 300 and the dummy sense amplifier 500 are high. It is possible for the first novel multilevel non-volatile semiconductor memory device to respond to variations in the power voltage level or in the ambient temperature, whereby an optimum read-out time period is obtainable. The acceptable temperature range in low voltage condition is widen and the first novel multilevel non-volatile semiconductor memory device exhibits highly stable read-out operations.

The read-out operations are made throughout the first, second and third read out time periods 1, 2 and 3. There is no difference in threshold voltage between an upper limit of memory cells which should turn ON and a lower limit of other memory cells which should turn OFF. It is unnecessary to extend the read out time period. This makes it possible to improve the high speed performance of the first novel multilevel non-volatile semiconductor memory device.

Figure 4:
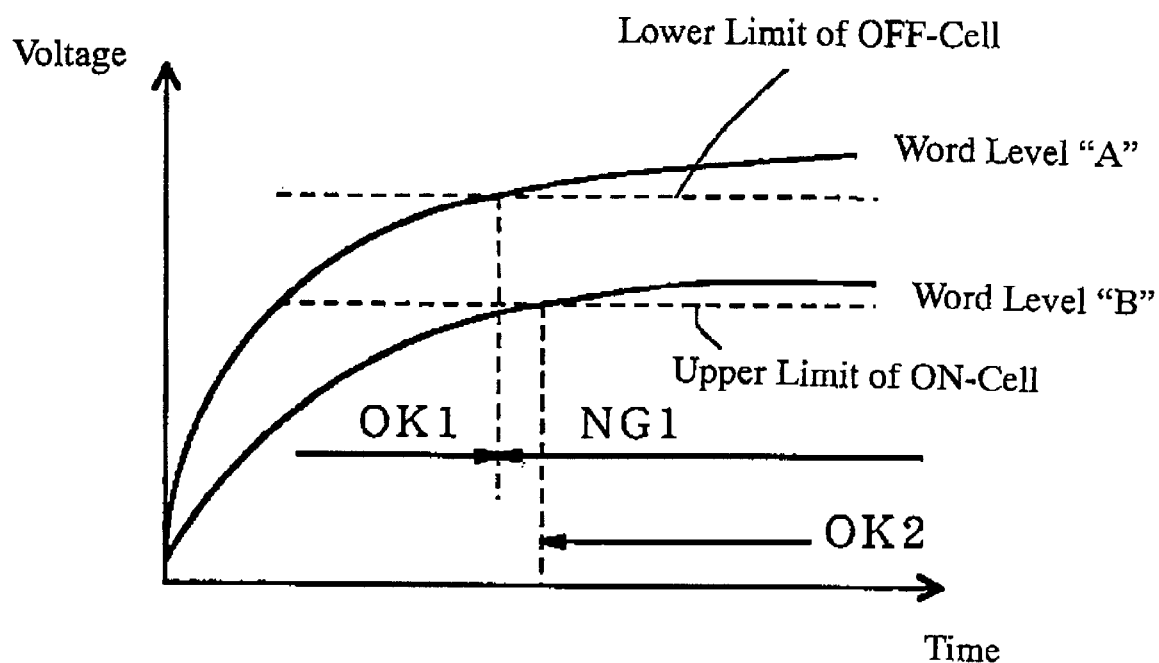
FIG. 4 is a diagram illustrative of variations in word level over time when the word level is supplied to the memory cell, when there is a difference in threshold voltage between an upper limit of memory cells which should turn ON and a lower limit of other memory cells which should turn OFF and also when the word level is high as a word level "A".
Figure 8:
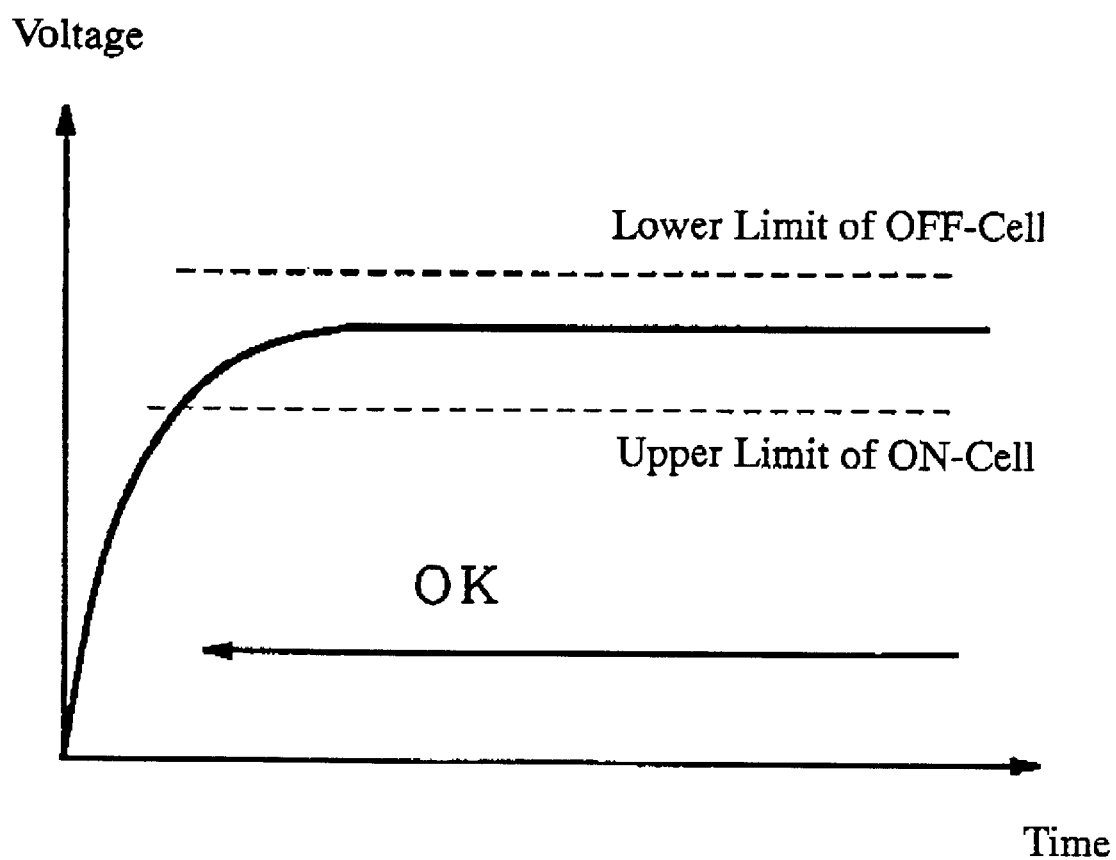
FIG. 8 is a diagram illustrative of variations in word level over time when the word level is supplied to the memory cells and the dummy memory cells, when there is a difference in threshold voltage between an upper limit of memory cells which should turn ON and a lower limit of other memory cells which should turn OFF.

The read-out completion signal 501 generated by the dummy sense amplifier 500 is also transmitted to the word level generator circuit 200 so that the word level generator circuit 200 discontinues the rise of the word level to prevent any excess increase in the word level. FIG. 8 is a diagram illustrative of variations in word level over time when the word level is supplied to the memory cells and the dummy memory cells, when there is a difference in threshold voltage between an upper limit of memory cells which should turn ON and a lower limit of other memory cells which should turn OFF. The real line represents the word level, whilst the lower broken line represents the upper limit of memory cells which should turn ON and the upper broken line represents the lower limit of other memory cells which should turn OFF. The word level is stable between the upper limit of memory cells which should turn ON and the lower limit of other memory cells which should turn OFF. This allows the stable read out operation free from the problems described with reference to FIG. 4.

For the conventional multilevel non-volatile semiconductor memory device, it is necessary that the word level generator circuit generates three words levels, for example, the first word level 1, the second word level 2 and the third word level 3. By contrast, in accordance with the first novel multilevel non-volatile semiconductor memory device, upon receipt of the read-out completion signal 501 from the dummy sense amplifier 500, word level generator circuit 200 discontinues the further rise of the word level, for which reason it is possible to obtain the same effect as the conventional device. This allows scaling down of the circuit.

Figure 9:
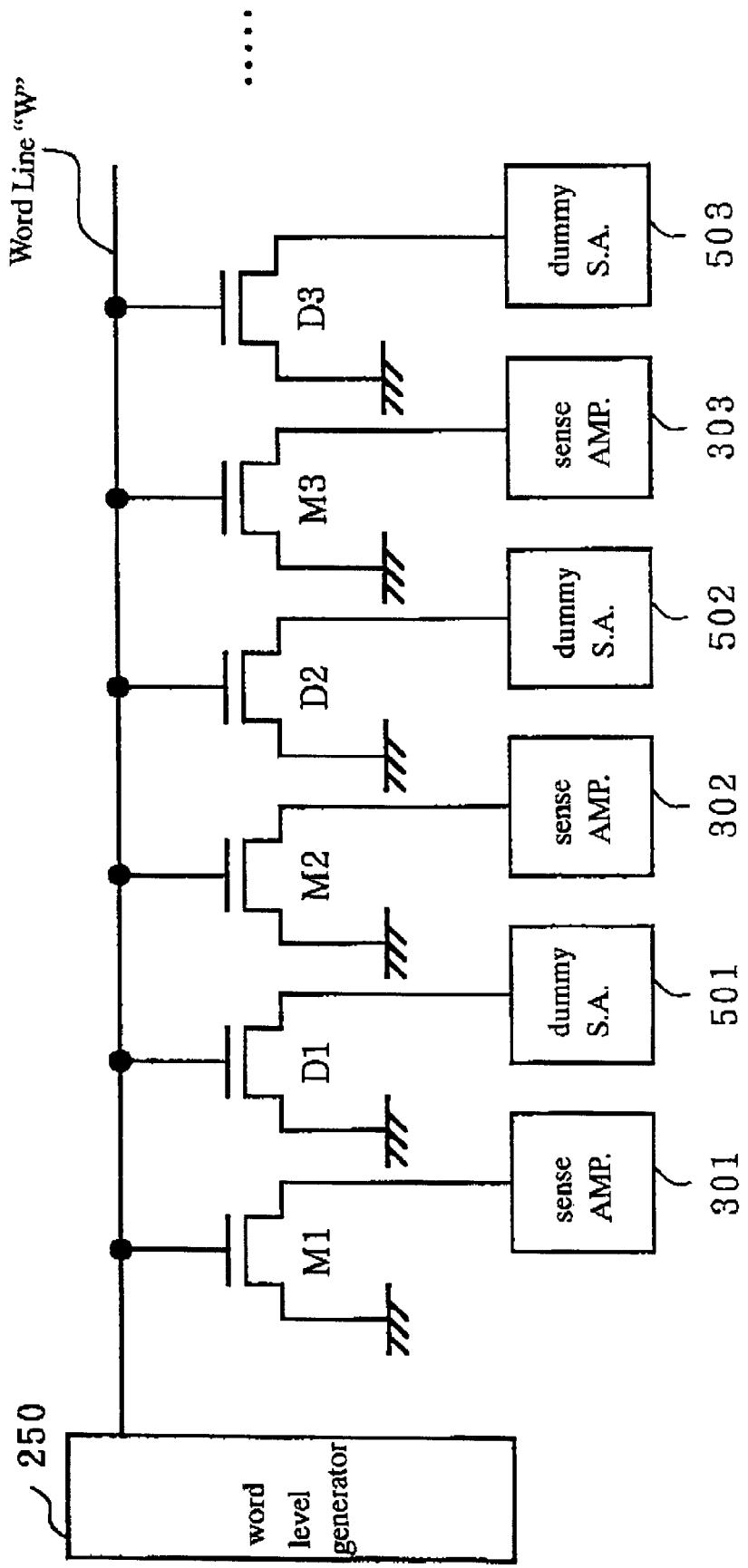
FIG. 9 is a fragmentary circuit diagram illustrative of a part of the circuit configuration of the second novel multilevel non-volatile semiconductor memory device as a first modification to the above first embodiment of the present invention.

As a first modification to the above first embodiment of the present invention, a second novel multilevel non-volatile semiconductor memory device may be provided, wherein a ratio in the number of the dummy memory cells 400 to the memory cells 100 is increased from that in the first novel multilevel non-volatile semiconductor memory device of FIG. 5. FIG. 9 is a fragmentary circuit diagram illustrative of a part of the circuit configuration of the second novel multilevel non-volatile semiconductor memory device as a first modification to the above first embodiment of the present invention. The same number of the dummy memory cells 400 as the memory cells 100 are provided. Also the same number of the dummy sense amplifiers 500 as the memory cells 100 are provided. Each of the word lines "W" is connected with a word level generator circuit 250. Plural memory cells M1, M2, M3 - - - Mn and plural dummy memory cells D1, D2, D3 - - - Dn are connected to the word line "W". The number of the memory cells M1, M2, M3 - - - Mn connected to the word line "W" is the same as the number of the dummy memory cells D1, D2, D3 - - - Dn connected to the same word line "W", wherein the memory cells M1, M2, M3 - - - Mn and the dummy memory cells D1, D2, D3 - - - Dn are alternately aligned along the word line "W". Plural sense amplifiers 301, 302, 303 - - - are connected to the memory cells M1, M2, M3 - - - Mn respectively to make plural pairs of the memory cell and the sense amplifier. Plural dummy sense amplifiers 501, 502, 503 - - - are also connected to the dummy memory cells D1, D2, D3 - - - Dn respectively to make plural pairs of the dummy memory cell and the dummy sense amplifier. The sense amplifiers 301, 302, 303 - - - and the dummy sense amplifiers 501, 502, 503 - - - are alternately aligned along the word line "W".

In order to send the word level generator circuit 250 an instruction about the timing of discontinuing the rise of the word level, the read-out completion signal 501 from the dummy sense amplifier 500 provided at the end of the word line "W" is supplied. The sense amplifiers 301, 302, 303 - - - and the dummy sense amplifiers 501, 502, 503 - - - are alternately aligned along the word line "W". It is possible to realize a highly accurate control to the read out operation time period by the individual sense amplifiers even if the threshold voltages of the memory cells vary over the memory cell array. It is, of course, possible to modify or change the ratio in the number of the dummy sense amplifiers to the sense amplifiers and also possible to modify or change the ratio in the number of the dummy sense amplifiers to the dummy memory cells. As the ratio in the number of the dummy sense amplifiers to the sense amplifiers is increased, the accuracy in control to the read-out operation time period is also improved.

In accordance with the first and second novel multilevel non-volatile semiconductor memory devices, the dummy memory cells are slowest in ON-speed and the dummy memory cell turns ON after all of the memory cells which should turn ON have turned ON, so that if the dummy memory cell turns ON, this means that all of the memory cells which should turn ON have already turned ON. It is, however, possible to modify the above into that the dummy memory cells are fastest in ON-speed and the dummy memory cell turns ON before all of the memory cells which should turn ON will turn ON, so that if the dummy memory cell turns ON, this means that all of the memory cells which should turn ON will subsequently turn ON.

As a second modification to the above first embodiment of the present invention and also to the first modification to the above first embodiment, a third novel multilevel non-volatile semiconductor memory device may be provided, wherein in addition to the dummy memory cells which are slowest in ON-speed, there are further provided the dummy memory cells which are fastest in ON-speed and the dummy memory cell turns ON before all of the memory cells which should turn ON will turn ON, so that if the dummy memory cell turns ON, this means that all of the memory cells which should turn ON will subsequently turn ON.

Figure 10:
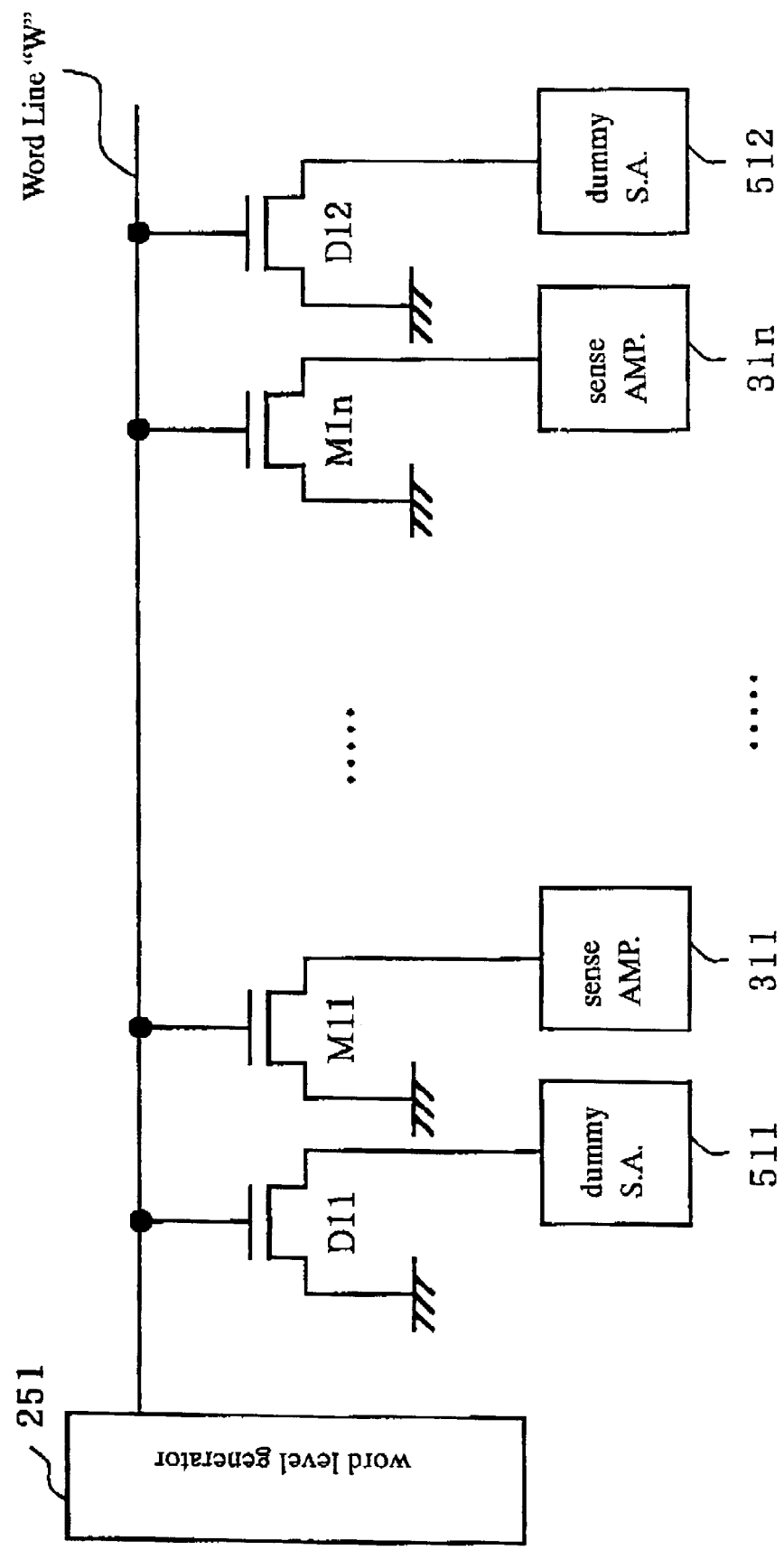
FIG. 10 is a fragmentary circuit diagram illustrative of a part of the circuit configuration of the third novel multilevel non-volatile semiconductor memory device as a second modification to the above first embodiment of the present invention.

FIG. 10 is a fragmentary circuit diagram illustrative of a part of the circuit configuration of the third novel multilevel non-volatile semiconductor memory device as a second modification to the above first embodiment of the present invention. Two dummy memory cells D11 and D12 are provided both at the start and end points of the word line "W". Namely, the first dummy memory cell D11 is provided at the start point of the word line "W" so that the first dummy memory cell D11 is fastest in ON-speed for allowing detection of the commencement of the read-out operation time period. The second dummy memory cell D12 is provided at the end point of the word line "W" so that the second dummy memory cell D12 is slowest in ON-speed for allowing detection of the completion of the read-out operation time period. The memory cells M11, - - - M1n are aligned along the word line "W" between the first and second dummy memory cells D11 and D12. A first dummy sense amplifier 511 is also provided which is connected to the first dummy memory cell D11. A second dummy sense amplifier 512 is also provided which is connected to the second dummy memory cell D12 are provided.

Figure 11:
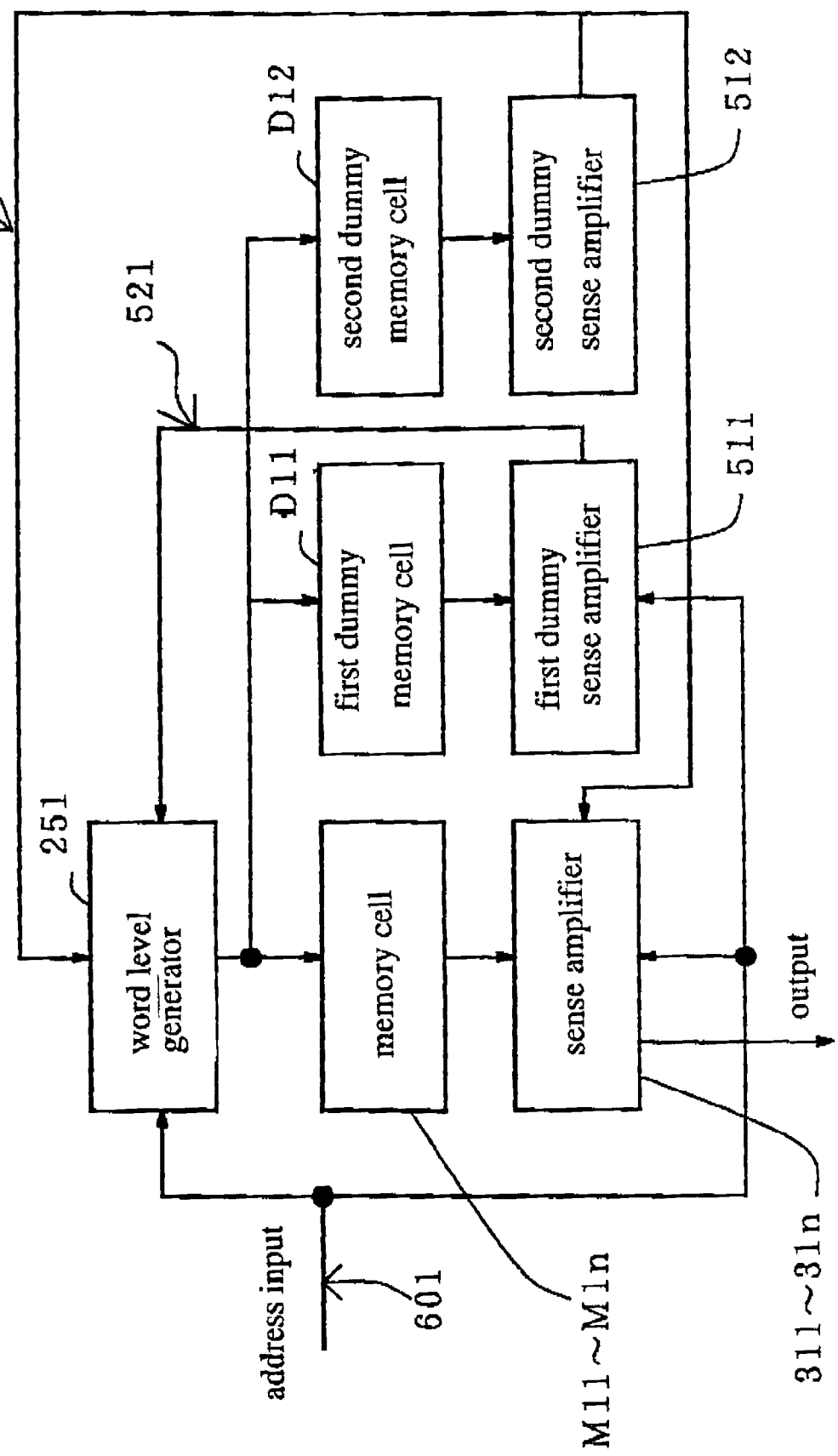
FIG. 11 is a block diagram illustrative of a second novel multilevel non-volatile semiconductor memory device additionally provided with first and second dummy memory cells and first and second dummy sense amplifiers for realizing a highly accurate control to the read-out time period in a second modification to the first embodiment according to the present invention.

FIG. 11 is a block diagram illustrative of a second novel multilevel non-volatile semiconductor memory device additionally provided with first and second dummy memory cells and first and second dummy sense amplifiers for realizing a highly accurate control to the read-out time period in a second modification to the first embodiment according to the present invention.

The third novel multilevel non-volatile semiconductor memory device has memory cells M11 - - - M1n capable of having plural threshold voltages. The third novel multilevel non-volatile semiconductor memory device also has a word level generator circuit 251 for generating plural word levels based on the plural threshold voltages of the memory cells M11 - - - M1n. The word level generator circuit 251 is connected to the memory cells M11 - - - M1n. The third novel multilevel non-volatile semiconductor memory device also has the same number of sense amplifiers 311 - - - 31n as the memory cells M11 - - - M1n for performing read-out operations from the memory cells M11 - - - M1n. The sense amplifiers 311 - - - 31n are also connected to the memory cells M11 - - - M1n.

The memory cells M11 - - - M1n have four different threshold vantages VT0, VT1, VT2 and VT3. The word level generator circuit 251 generates three different word levels, for example, a first word level 1 for causing the memory cells having the first threshold voltage VT0 to turn ON, a second word level 2 for causing the memory cells having the second threshold voltage VT1 to turn ON, and a third word level 3 for causing the memory cells having the third threshold voltage VT2 to turn ON. The sense amplifiers 311 - - - 31n serve as the memory cell read-out circuit for reading out informations from the memory cells M11 - - - M1n.

The third novel multilevel non-volatile semiconductor memory device further has a first dummy memory cell D11 having the same cell structure as the memory cells M11 - - - M1n. The first dummy memory cell D11 is connected to the memory cells M11 - - - M1n. The first dummy memory cell D11 is also connected to the word level generator circuit 251, so that the word level voltages generated by the word level generator circuit 251 are applied to both the memory cells M11 - - - M1n and the first dummy memory cell D11. The third novel multilevel non-volatile semiconductor memory device further has a first dummy sense amplifier 511 which is connected to the first dummy memory cell D11. The first dummy sense amplifier 511 is not connected to the sense amplifiers 311 - - - 31n. The first dummy sense amplifier 511 is connected to the word level generator circuit 251. The first dummy sense amplifier 511 has the same circuit configuration as the sense amplifiers 311 - - - 31n. The first dummy sense amplifier 511 performs read-out operations from the first dummy memory cell D11 in accordance with the word level voltages applied to the first dummy memory cell D11. In the first dummy memory cell D11, the threshold voltage is previously prepared for causing turning-ON operation during the read out time period, for example, the first, second and third threshold voltages VT0, VT1, and VT2 are prepared. It is necessary that the first dummy memory cell D11 is fastest in ON-timing or ON-speed, for which reason the first dummy memory cell D11 is provided at the start point of the word line "W", wherein the start point of the word line "W" has the least delay. The first dummy memory cell D11 is lower in threshold voltage than the memory cells M11 - - - M1n.

The first dummy sense amplifier 511 generates a read-out commencement signal 521 when the first dummy memory cell D11 turns ON by the predetermined threshold voltage. The read-out commencement signal 521 is transmitted to only the word level generator circuit 251 but not transmitted to the sense amplifiers 311 - - - 31n. The word level generator circuit 251 switches the output path to include a high resistance so that the word level generator circuit 251 supplies the word level through the high resistance thereby causing a rapid decline to the rise of the word level.

The third novel multilevel non-volatile semiconductor memory device further has a second dummy memory cell D12 having the same cell structure as the memory cells M11 - - - M1n. The second dummy memory cell D12 is connected to the memory cells M11 - - - M1n. The second dummy memory cell D12 is also connected to the word level generator circuit 251, so that the word level voltages generated by the word level generator circuit 251 are applied to both the memory cells M11 - - - M1n and the second dummy memory cell D12. The third novel multilevel non-volatile semiconductor memory device further has a second dummy sense amplifier 512 which is connected to the second dummy memory cell D12. The second dummy sense amplifier 512 is connected to the sense amplifiers 311 - - - 31n. The second dummy sense amplifier 512 is also connected to the word level generator circuit 251. The second dummy sense amplifier 512 has the same circuit configuration as the sense amplifiers 311 - - - 31n. The second dummy sense amplifier 512 performs read-out operations from the second dummy memory cell D12 in accordance with the word level voltages applied to the second dummy memory cell D12. In the second dummy memory cell D12, the threshold voltage is previously prepared for causing turning-ON operation during the read out time period, for example, the first, second and third threshold voltages VT0, VT1, and VT2 are prepared. It is necessary that the second dummy memory cell D12 is slowest in ON-timing or ON-speed, for which reason the second dummy memory cell D12 is provided at the end point of the word line "W", wherein the start point of the word line "W" has the least delay. The second dummy memory cell D12 is lower in threshold voltage than the memory cells M11 - - - M1n.

The second dummy sense amplifier 512 generates a read-out completion signal 522 when the second dummy memory cell D12 turns ON by the predetermined threshold voltage. The read-out completion signal 522 is transmitted to both the word level generator circuit 251 and the sense amplifiers 311 - - - 31n. The word level generator circuit 251 discontinues the rise of the word level upon receipt of the input of the read-out completion signal 522. The sense amplifiers 311 - - - 31n also discontinue the read-out operations with a delay from the input timing of the read-out completion signal 522 for ensuring a sufficient read out operation time period. The second dummy sense amplifier 512 serves as the read out end timing controller.

A read-out start signal 601 instructing to start the read out operation is inputted into the word level generator circuit 251, the sense amplifiers 311 - - - 31n and the first dummy sense amplifier 511. Upon receipt of the read-out start signal 601, the word level generator circuit 251, the sense amplifiers 311 - - - 31n and the first dummy sense amplifier 511 start the individual operations. Upon receipt of the read-out start signal 600, the first dummy sense amplifier 511 generates the read-out commencement signal 521 which is then transmitted to only the word level generator circuit 251 but not transmitted to the sense amplifiers 311 - - - 31n. The word level generator circuit 251 switches the output path to include a high resistance so that the word level generator circuit 251 supplies the word level through the high resistance thereby causing a rapid decline to the rise of the word level.

Figure 12:
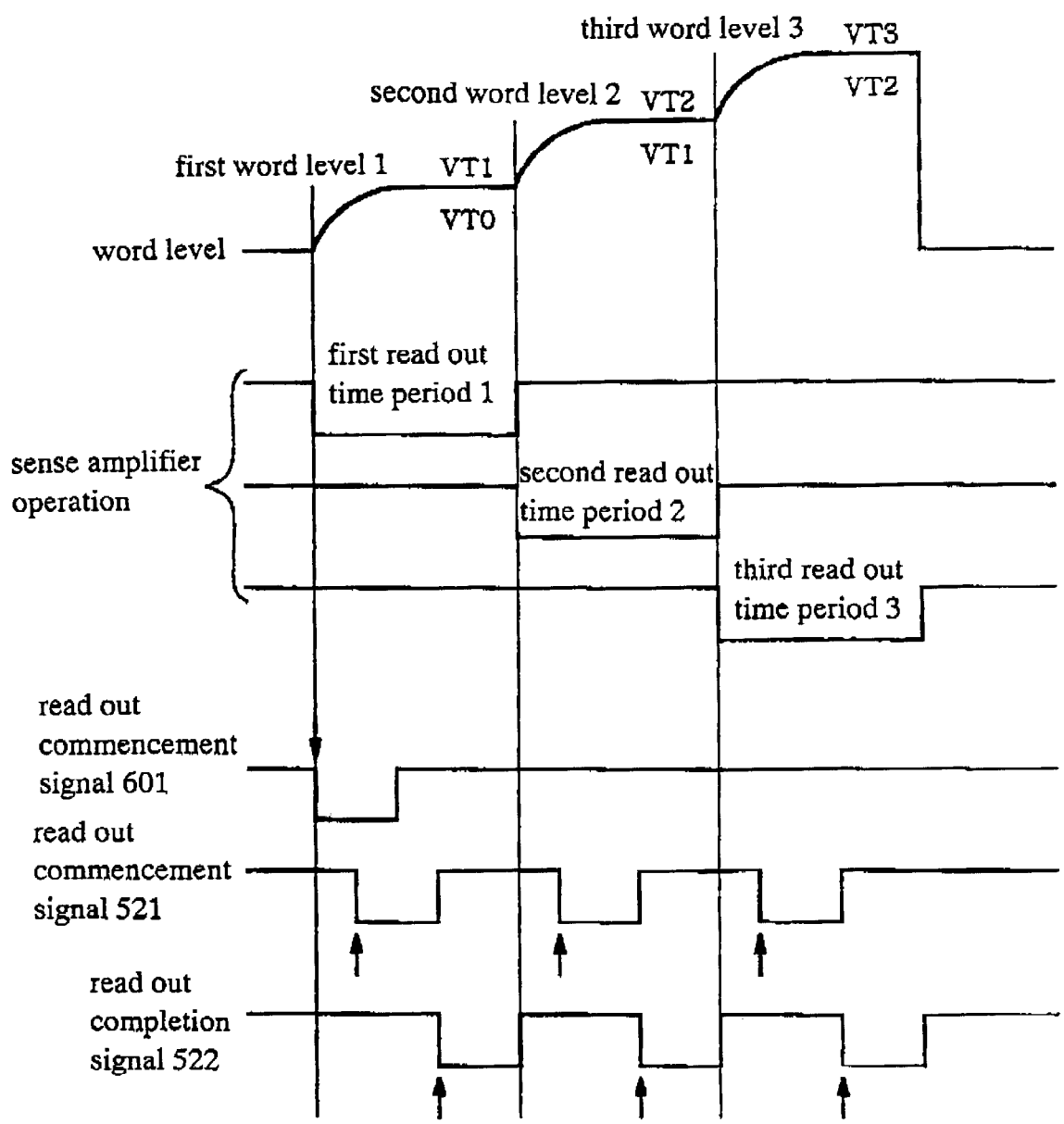
FIG. 12 is a diagram illustrative of the word level, the sense amplifier operation and the read-out start signal, the read-out commencement signal and the read-out completion signal of the third novel multilevel non-volatile semiconductor memory device of FIG. 11.

Operations of the above third novel multilevel non-volatile semiconductor memory device will subsequently be described in detail. FIG. 12 is a diagram illustrative of the word level, the sense amplifier operation and the read-out start signal, the read-out commencement signal and the read-out completion signal of the third novel multilevel non-volatile semiconductor memory device of FIG. 11. The word level generated by the word level generator circuit 251 is shown. The read out operation timing of the sense amplifiers 311 - - - 31n is also shown. The input timing of the read-out start signal 601 into the word level generator circuit 251, the sense amplifiers 311 - - - 31n and the first dummy sense amplifier 511 is shown. The output timing of the read-out commencement signal from the first dummy sense amplifier 511 is shown. The output timing of the read-out completion signal from the second dummy sense amplifier 512 is shown.

In order to conduct the read-out operations from the memory cells M11 - - - M1n, an address is inputted whereby the read-out start signal 601 is generated which is then transmitted into the word level generator circuit 251, the sense amplifiers 311 - - - 31n and the first dummy sense amplifier 511. The first dummy memory cell D11 is positioned at the start point of the word line so that the first dummy memory cell D11 turns ON before any of the memory cells M11 - - - M1n turn ON. The first dummy sense amplifier 511 generates a read-out commencement signal 521 when the first dummy memory cell D11 turns ON by the predetermined threshold voltage. The read-out commencement signal 521 is then transmitted to only the word level generator circuit 251 but not transmitted to the sense amplifiers 311 - - - 31n. The word level generator circuit 251 rises the word level to be supplied to the memory cells M11 - - - M1n and the first and second dummy memory cells D11 and D12. The word level generator circuit 251 sequentially generate three different word levels, for example, the first word level 1, the second word level 2 which is higher than the first word level 1 and the third word level 3 which is higher than the second word level 2.

The sense amplifiers 311 - - - 31n cause the memory cells having a first threshold voltage VT0 to turn ON upon receipt of the input of the first word level 1, so that the sense amplifiers 311 - - - 31n perform a first read-out operation from the ON-memory cells in a first read-out time period 1. The sense amplifiers 311 - - - 31n cause the memory cells having a second threshold voltage VT1 to turn ON upon receipt of the input of the second word level 2, so that the sense amplifiers 311 - - - 31n perform a second read-out operation from the ON-memory cells in a second read-out time period 2. The sense amplifiers 311 - - - 31n cause the memory cells having a third threshold voltage VT2 to turn ON upon receipt of the input of the third word level 3, so that the sense amplifiers 311 - - - 31n perform a third read-out operation from the ON-memory cells in a third read-out time period 3.

Since the second dummy memory cell D12 is provided at the end point of the word line "W", the second dummy memory cell D12 is slowest in ON-timing or ON-speed, wherein the start point of the word line "W" has the least delay. The second dummy sense amplifier 512 generates a read-out completion signal 522 when the second dummy memory cell D12 turns ON by the predetermined threshold voltage after all of the memory cells which should turn ON have turned ON. The read-out completion signal 522 is transmitted to both the word level generator circuit 251 and the sense amplifiers 311 - - - 31n. The word level generator circuit 251 discontinues the rise of the word level upon receipt of the input of the read-out completion signal 522. The sense amplifiers 311 - - - 31n also discontinue the read-out operations with a delay from the input timing of the read-out completion signal 522 for ensuring a sufficient read out operation time period. The second dummy sense amplifier 512 serves as the read out end timing controller.

The read-out commencement signal 521 from the first dummy sense amplifier 511 serves as a signal which instructs the commencement of the read-out operation in each of the first, second and third read out time periods 1, 2 and 3. The read-out completion signal 522 from the second dummy sense amplifier 512 serves as a signal which instructs the discontinuation of the read-out operation in each of the first, second and third read out time periods 1, 2 and 3. After the read-out completion signal 522 is generated by the second dummy sense amplifier 512 for the first read-out time period 1, then the second read out time period 2 starts. After the read-out completion signal 522 is generated by the second dummy sense amplifier 512 for the second read-out time period 2, then the third read out time period 3 starts. When the read-out completion signal 522 is generated by the second dummy sense amplifier 512 for the third read-out time period 3, the read-out operation for reading multilevel informations from one memory cell is completed.

As described above, in accordance with the present invention, the third novel multilevel non-volatile semiconductor memory device is additionally provided with both a first pair of the first dummy memory cell D11 and the first dummy sense amplifier 511 for detecting the timing of commencement of the read-out operation for each of the first, second and third read-out time periods 1, 2 and 3 and a second pair of the second dummy memory cell D12 and the second dummy sense amplifier 512 for detecting the timing of completion of the read-out operation for each of the first, second and third read-out time periods 1, 2 and 3, whereby the third novel multilevel non-volatile semiconductor memory device improves the highly accurate control to the read-out operation time period.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A multi-level non-volatile semiconductor memory device comprising:
    plural memory cells having plural threshold levels for allowing the plural memory cells to turn ON or OFF in accordance with relationships of word levels to the plural threshold levels;
    a word level generating the word levels in every read out time periods for the plural threshold levels;
    a memory cell read-out circuit for reading out informations from the memory cells;
    at least one dummy memory cell corresponding to each of the word levels, these dummy memory cells receiving inputs of the word levels and having substantially the same threshold levels as the memory cells for allowing the dummy cells to turn ON with delay from the memory cells; and
    a read out end timing controller for controlling the word level generator circuit to discontinue rising the word level when the corresponding dummy memory cells turn ON, and also for controlling the memory cell read-out circuit to finish the read out operations.

2. The multilevel non-volatile semiconductor memory device as claimed in claim 1, wherein the read-out end timing controller controls the memory cell read-out circuit to finish the read-out operation with a delay after the word level generator circuit has discontinued the rise of the word level.

3. The multilevel non-volatile semiconductor memory device as claimed in claim 1, wherein the number of the dummy memory cells is greater than a minimum number necessary for controlling the read-out time period.

4. The multilevel non-volatile semiconductor memory device as claimed in claim 1, wherein an equal number of the dummy memory cells and the memory cells are connected to each of the word lines, with the dummy memory cells and the memory cells alternately aligned along each word line.

5. The multilevel non-volatile semiconductor memory device as claimed in claim 1, wherein the dummy memory cells have the same cell structure as the memory cells and the dummy memory cells are provided at end points of word lines, so that the dummy memory cells turn ON after the memory cells turn ON.

6. The multilevel non-volatile semiconductor memory device as claimed in claim 5, further comprising additional dummy cells having the same structure as the memory cells, so that a start-timing of read out operation is detectable by confirming ON or OFF of the additional dummy cells.

7. The multilevel non-volatile semiconductor memory device as claimed in claim 6, wherein the additional dummy memory cells are provided at start points of the word lines, so that the additional dummy memory cells turn ON before the memory cells turn ON.

8. The multilevel non-volatile semiconductor memory device as claimed in claim 6, further comprising a read out start timing controller for controlling the word level generator circuit to rise the word level when the additional dummy memory cell turns ON.

9. The multilevel non-volatile semiconductor memory device as claimed in claim 1, wherein the dummy memory cells are higher in threshold level than the memory cells.

10. A multilevel non-volatile semiconductor memory device having plural word lines, each of the word lines having:
    a word level generator circuit generating word levels supplied to the each word line in every read out time periods for plural threshold levels;
    plural memory cells being connected to the each word line, the plural memory cells having plural threshold levels for allowing the plural memory cells to turn ON or OFF in accordance with relationships of word levels to the plural threshold levels;
    a memory cell read-out circuit being connected to the each word line for reading out informations from the memory cells;
    at least a dummy memory cell corresponding to each of the word levels and being connected to the each word line for receiving inputs of the word levels and having substantially the same threshold levels as the memory cells connected to the each word line for allowing the at least one dummy cell to turn ON with delay from the memory cells; and
    at least a read out end timing controller being connected to the at least one dummy memory cell and also connected to the word level generator circuit for controlling the word level generator circuit to discontinue rising the word level when the at least one dummy memory cell turns ON, and also for controlling the memory cell read-out circuit to finish the read out operations.

11. The multilevel non-volatile semiconductor memory device as claimed in claim 10, wherein the at least one read-out end timing controller controls the memory cell read-out circuit to finish the read-out operation with a delay after the word level generator circuit has discontinued the rise of the word level.

12. The multilevel non-volatile semiconductor memory device as claimed in claim 10, wherein a first plurality of the dummy memory cells are connected to a first word line and a second plurality of memory cells are connected to a second word line.

13. The multilevel non-volatile semiconductor memory device as claimed in claim 12, wherein an equal number of the dummy memory cells and the memory cells are connected to each word line, the dummy memory cells and the memory cells alternately aligned along the each word line.

14. The multilevel non-volatile semiconductor memory device as claimed in claim 10, wherein the at least one dummy memory cell has the same cell structure as the memory cells and the at least one dummy memory cell is provided at an end point of the each word line, so that the at least one dummy memory cell turns ON after the memory cells turn ON.

15. The multilevel non-volatile semiconductor memory device as claimed in claim 14, wherein the each word line further has at least an additional dummy cell having the same structure as the memory cells, so that a start-timing of read out operation is detectable by confirming ON or OFF of the at least one additional dummy cell.

16. The multilevel non-volatile semiconductor memory device as claimed in claim 15, wherein the at least one additional dummy memory cell is provided at a start point of the each word line, so that the at least one additional dummy memory cell turns ON before the memory cells turn ON.

17. The multilevel non-volatile semiconductor memory device as claimed in claim 15, further comprising at least a read out start timing controller to the each word line for controlling the word level generator circuit to rise the word level when the at least one additional dummy memory cell turns ON.

18. The multilevel non-volatile semiconductor memory device as claimed in claim 10, wherein the at least one dummy memory cell is higher in threshold level than the memory cells.

* * * * *